(12) United States Patent
Paone et al.

(10) Patent No.: US 10,171,098 B2
(45) Date of Patent: Jan. 1, 2019

(54) ANALOG-TO-DIGITAL CONVERTER (ADC) WITH IMPROVED POWER DISTURBANCE REDUCTION

(71) Applicant: SK hynix Inc., Gyeonggi-do (KR)

(72) Inventors: Luigi Paone, Agrate Brianza (IT); Marco Passerini, Agrate Brianza (IT)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/817,555

(22) Filed: Nov. 20, 2017

(65) Prior Publication Data
US 2018/0145698 A1    May 24, 2018

(30) Foreign Application Priority Data
Nov. 23, 2016  (IT) ................ 102016000118790

(51) Int. Cl.
  *H03M 1/36*  (2006.01)
  *H03M 1/18*  (2006.01)
  *H03M 1/08*  (2006.01)
  *G01K 13/00* (2006.01)
(52) U.S. Cl.
  CPC ......... H03M 1/182 (2013.01); H03M 1/0845 (2013.01); H03M 1/36 (2013.01); *G01K 13/00* (2013.01); *G01K 2219/00* (2013.01); *H03M 1/361* (2013.01)
(58) Field of Classification Search
  CPC ............................. H03M 1/182; H03M 1/36
  USPC .................................................. 341/155–159
  See application file for complete search history.

(56) References Cited

U.S. PATENT DOCUMENTS

| | | | | |
|---|---|---|---|---|
| 5,644,218 A | * | 7/1997 | Emmerich | H02H 7/001 323/360 |
| 5,742,513 A | * | 4/1998 | Bouhenguel | G01R 31/3278 324/418 |
| 6,433,724 B1 | * | 8/2002 | Confalonieri | H03M 1/068 341/155 |
| 7,576,606 B2 | * | 8/2009 | Andersen | H03F 3/217 330/10 |
| 7,728,658 B2 | * | 6/2010 | Andersen | H03F 1/26 330/10 |
| 2004/0152944 A1 | * | 8/2004 | Medvedev | A61M 1/101 600/17 |

(Continued)

FOREIGN PATENT DOCUMENTS

EP    2903165    5/2015

OTHER PUBLICATIONS

Extended Search Report Issued by Italian Patent office dated Aug. 2, 2017.

*Primary Examiner* — Lam T Mai
(74) *Attorney, Agent, or Firm* — IP & T Group LLP

(57) ABSTRACT

Disclosed herein is an analog-to-digital converter (ADC) for converting an input analog voltage to an output digital code, the ADC comprising a first node of the input analog voltage; nodes of a plurality of reference voltages; a plurality of comparators, inputs of each comparator being coupled to the first node and a node of a corresponding reference voltage of the plurality of reference voltages; a logic circuit block for receiving outputs of the plurality of comparators and generating the output digital code; and a voltage stabilizer, terminals of the voltage stabilizer being coupled with the first node and a node of a first reference voltage among the plurality of reference voltages.

18 Claims, 11 Drawing Sheets

(56) References Cited

U.S. PATENT DOCUMENTS

2008/0074301 A1    3/2008  Ueno
2014/0346953 A1*   11/2014 Hsiung .............. H05B 33/0815
                                                  315/121
2017/0054448 A1    2/2017  Lye et al.

* cited by examiner

ANALOG-TO-DIGITAL CONVERTER (ADC) WITH IMPROVED POWER DISTURBANCE REDUCTION

CROSS-REFERENCE TO RELATED APPLICATION

The present application claims priority under 35 U.S.C. § 119(a) to Italian patent application number 102016000118790, filed on Nov. 23, 2016, the entire disclosure of which is incorporated herein by reference in its entirety.

FIELD OF THE INVENTION

The present disclosure relates to an analog-to-digital converter (ADC) with improved power disturbance reduction.

BACKGROUND OF THE INVENTION

An analog-to-digital converter (ADC) is used to convert an analog output from an analog signal source (e.g., an analog sensor) to a digital code. For instance, an ADC can be used for temperature measurement in a semiconductor device such as a Flash memory. In a semiconductor device, temperature information from a temperature sensor and an ADC can be delivered to a microcontroller. Voltage values for various semiconductor operations (e.g., read, write, program, and erase) are adjusted accordingly by the microcontroller based on the temperature information to improve the semiconductor's operational characteristics such as voltage distribution margins.

When an analog sensor and an ADC block are used, it usually takes time ranging from a few hundreds of nano-seconds to a few micro-seconds for a startup and analog-to-digital (AD) conversion.

Concerning a "startup time," every analog circuit needs some time to reach a stationary DC state after an enable signal is applied. In a startup operation, DC bias currents and DC bias voltages for the components of an analog circuit need to start from 0 (or from a predetermined value) and reach their respective stationary values. This time can be thus defined as a "startup time," and the phase for which the analog circuit reaches its stationary state is usually indicated as a "startup phase," An analog sensor and an ADC operate in the same manner for their startup.

On the other hand, a "conversion time" is usually regarded as the time needed by an ADC to convert an analog signal from an analog sensor to a digital code after both circuits have reached their stationary state, and the corresponding phase can be indicated as a "conversion phase".

In some cases, these two phases (i.e., the startup phase and the conversion phase) are not separable, and they could take place simultaneously. In these cases, it is not possible to distinguish between the startup time and the conversion time.

Usually, an analog sensor and an ADC need a certain period of time, which may range from some hundreds of nano-seconds to a few micro-seconds, after an enable signal is applied to output a valid digital code. This time is needed for the purpose of the circuit startup and the AD conversion that may take place simultaneously.

During this time, other operations inside the semiconductor device comprising the analog sensor and the ADC, such as a charge pump rum on, are not recommended, because of possible power supply- or ground-induced disturbances, which would negatively affect the conversion operation of the ADC and the temperature sensing performed by the analog sensor. A possible disturbance during the startup and the conversion may eventually impact the semiconductor's operational characteristics such as a read time, a write time, a program time, and an erase time of the semiconductor device.

Accordingly, a novel ADC configuration is needed to reduce the impact of a power supply or ground disturbance in order to improve the performance of a semiconductor device.

SUMMARY OF THE INVENTION

Embodiments of die invention are directed to analog-to-digital converter (ADC) for converting an input analog voltage to an output digital code.

One of the objectives of the present disclosure is to reduce the negative effects of ripple or fluctuation due to the power supply and around voltage on an analog-to-digital converter (ADC) during a conversion phase. This issue may happen, for example, during the simultaneous operation of the ADC and a charge pump or other source of power supply or ground disturbances in a semiconductor device.

In an embodiment of the invention, an analog-to-digital converter (ADC) for converting an input analog voltage to an output digital code comprises a first node of the input analog voltage; nodes of a plurality of reference voltages; a plurality of comparators, inputs of each comparator being coupled to the first node and a node of a corresponding reference voltage among the plurality of reference voltages; a logic circuit block for receiving outputs of the plurality of comparators and generating the output digital code; and a voltage stabilizer, terminals of the voltage stabilizer being coupled with the first node and a node of a first reference voltage among the plurality of reference voltages.

In another embodiment of the invention, an analog-to-digital converter (ADC) comprises an input node suitable for receiving an analog signal, a comparator suitable for receiving the analog signal at a first input and a reference voltage at a second input and for outputting a result based on comparison of the analog signal and the reference voltage, the comparator comprising a capacitive stabilizer connected to the first input and the second input in common; and an output node suitable for outputting a digital signal based on the result output from the comparator.

BRIEF DESCRIPTION OF THE DRAWINGS

The characteristics and advantages of the disclosure will be apparent from the following description of embodiments thereof given by way of indicative and non-limiting example with reference to the annexed drawings, in which.

DETAILED DESCRIPTION OF THE EMBODIMENTS

Figure 1:
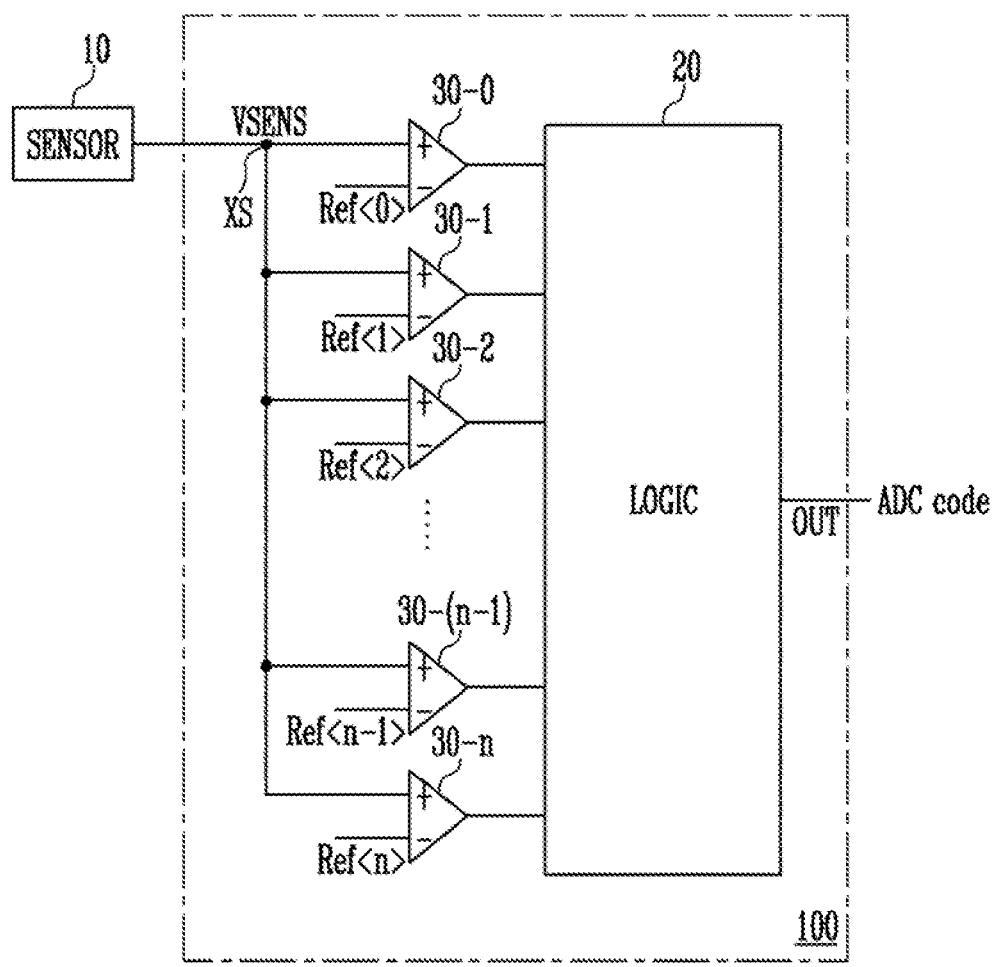
FIG. 1 shows an analog-to-digital converter (ADC) for temperature sensing in a semiconductor device according to one embodiment.

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention. The terms and words used in the specification and claims should not be construed as their ordinary or dictionary sense. On the basis of the principle that the inventor can define the appropriate concept of a term in order to describe his/her own invention in the best way, it should be construed as a meaning and concepts for complying with the technical idea of the present invention. In addition, detailed descriptions of constructions well known in the art may be omitted to avoid unnecessarily obscuring the gist of the present invention.

In the drawings, corresponding features are identified by the same reference numerals.

FIG. 1 shows an exemplary ADC for temperature sensing in a semiconductor according to one embodiment. The semiconductor may be any suitable type of analog and/or digital integrated circuits. Examples of the semiconductor include a microprocessor, an electronic sensor, and a memory device such as DRAM, Flash, and a resistive memory.

In accordance with one embodiment, the ADC 100 may be coupled with a sensor 10 and comprise a logic block 20 and a plurality of comparators 30-0~30-$n$ inserted between an output node of the sensor 10, which is indicated as sense node XS, and the logic block 20. The non-inverting inputs of the comparators 30-0~30-$n$ may be coupled with the sensor 10 via the sense node XS, which provides an analog sense voltage VSENS. The comparators 30-0~30-$n$ may also receive, at each of their inverting inputs, a corresponding output voltage from a reference voltage generation block, which provides a plurality of reference voltages Ref<0>~Ref<n>.

The logic block 20 generates an ADC code at its output terminal OUT, based on the results of the comparison by the plurality of comparators 30-0~30-$n$. More particularly, the reference voltages Ref<0>~Ref<n> may have different voltage levels from each other such that the analog input voltage, i.e. the sense voltage VSENS from the sensor 10 can be measured in a step-wise manner. For ease of description, it is assumed herein that the voltage levels increase from the reference voltage Ref<0> to the reference voltage Ref<n>.

Figure 2:
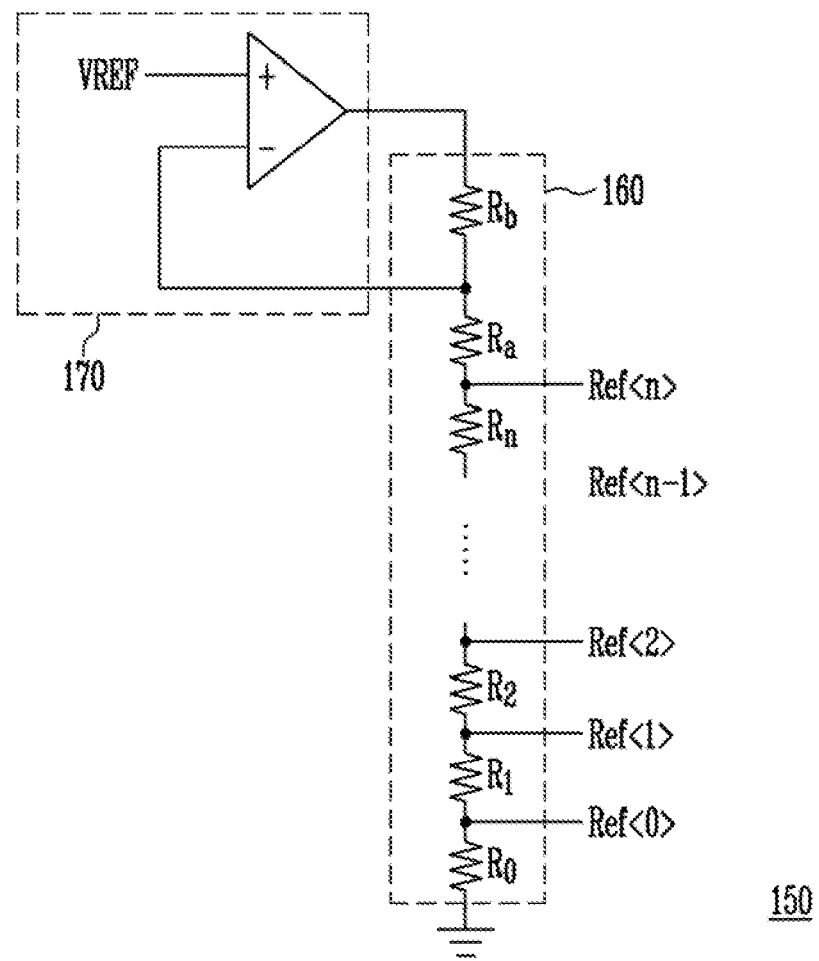
FIG. 2 shows a voltage generation block for generating the plurality of reference voltages according to one embodiment.

FIG. 2 shows a reference voltage generation block 150 for generating the plurality of reference voltages Ref<0>~Ref<n> in accordance with one exemplary embodiment.

The reference voltage generation block 150 may comprise a voltage divider 160 and an operational amplifier with negative feedback 170, the voltage divider 160 being coupled between an output of operational amplifier 170 and ground. A common reference voltage VREF is provided to the reference voltage generator 150. The voltage divider 160 may comprise a plurality of resistors $R_1$~$R_n$, in series between the output of the operational amplifier 170 and ground, and a plurality of output nodes of the voltage divider 160 are defined to provide the reference voltages Ref<0>~Ref<n>.

If there is a ripple or fluctuation in the supply voltage, e.g., due to a charge pump turn-on and operation, some extent of this ripple or fluctuation can be coupled to all the reference voltages Ref<0>~Ref<n>. In addition, the output voltage XS of sensor block 10 as shown in FIG. 1 could be adversely affected by power supply or ground disturbances.

One method of reducing these negative effects is to stop operating any source of a power disturbance during an AD conversion. However, turning off all possible sources of a power supply or ground disturbance in a semiconductor device during an AD conversion can adversely impact the device's overall performance, such as extending a read time, a write time, a program time, or an erase time.

Figure 3:
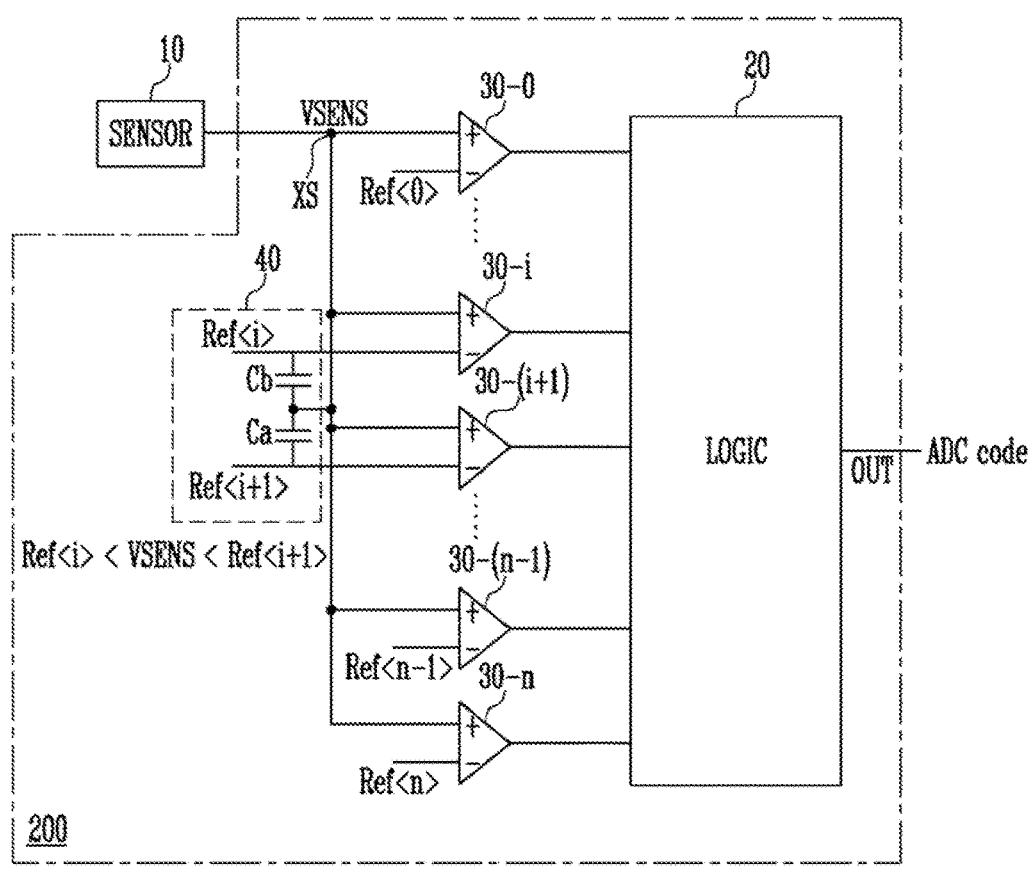
FIG. 3 shows an ADC coupled with a sensor according to one embodiment.

FIG. 3 shows an ADC 200 coupled with a sensor 10 according to one embodiment.

In accordance with one exemplary embodiment, the ADC 200 may convert an input analog voltage VSENS to an output digital code or ADC code. More specifically, the ADC 200 may comprise a first or input node XS for receiving the input analog voltage VSENS provided by a sensor 10. Hereinafter, the input node XS can be interchangeably indicated as sense node, and the input analog voltage VSENS can be interchangeably indicated as sense voltage.

The ADC 200 may further comprise a plurality of comparators 30-0~30-$n$, which are coupled between the sense node XS and a plurality of input terminals of a logic circuit block 20, and the plurality of comparators 30-0~30-$n$ may receive, at their respective inputs, a plurality of reference voltages Ref<0>~Ref<n>.

Further, the input of each comparator 30-$i$ may receive the input analog voltage or sense voltage VSENS and a corresponding reference voltage Ref<i> of the plurality of reference voltages Ref<0>~Ref<n>.

The logic circuit block 20 is adapted to receive outputs of the plurality of comparators 30-0~30-$n$ and to generate the output digital code ADC at an output terminal OUT.

In accordance with one exemplary embodiment, the ADC 200 may be adapted to determine, among the plurality of reference voltages Ref<0>~Ref<n>, a first reference voltage Ref<i+1> having a voltage level greater than the current input analog voltage or sense voltage VSENS at the sense node XS. Further, the ADC 200 may be adapted to determine, among the plurality of reference voltages, a second reference voltage Ref<i> having a voltage level smaller than the current input analog voltage or sense voltage VSENS of the sense node XS.

The ADC 200 may comprise a voltage stabilizer 40. The voltage stabilizer 40 may be coupled to the sense node XS and at least one reference voltage among the plurality of reference voltages Ref<0>~Ref<n>. According to one embodiment as shown in FIG. 3, the voltage stabilizer 40 may be coupled to the sense node XS, a node of the first reference voltage Ref<i+1>, and a node of the second reference voltage Ref<i>. In addition, the voltage stabilizer may include any suitable circuit elements configured to prevent a rapid voltage change in sense node XS and contain sense voltage VSENS between adjacent reference voltages among the reference voltages Ref<0>~Ref<n>. For instance, the voltage stabilizer may be a block including at least one capacitor, as described in FIG. 3. The voltage stabilizer 40 may include at least a first capacitor Ca. In addition, the voltage stabilizer 40 may further include a second capacitor Cb. More specifically, the first capacitor Ca may be coupled between an input terminal of a comparator 30-(i+1) receiving the first reference voltage Ref<i+1> and the sense node XS, and the second capacitor Cb may be coupled between the sense node XS and an input terminal of another comparator 30-i receiving the second reference voltage Ref<i>.

In accordance with one embodiment, terminals of the first capacitor Ca may receive the input analog voltage or sense voltage VSENS of the sense node XS and the first reference voltage Ref<i+1>, and terminals of the second capacitor $C_b$ may receive the input analog voltage or sense voltage VSENS of the sense node XS and the second reference voltage Ref<i>.

When the voltage stabilizer 40 is added to the ADC as shown in FIG. 1, the ADC 200 may require an additional logic block to control the selection of reference voltages to be coupled to each capacitor of the voltage stabilizer 40. Exemplary embodiments of the additional logic block circuit will be explained below with reference to other figures.

In accordance with an alternative embodiment, only one capacitor C may be used. The ADC 200 may thus comprise a capacitor C, which may receive the input analog voltage or sense voltage VSENS of the sense node XS and a reference voltage Ref<i>. The reference voltage Ref<i> may set to be the closest to the input analog voltage or sense voltage VSENS of the sense node XS. In this case, the voltage level of the reference voltage Ref<i> may be higher than the current input analog voltage or sense voltage VSENS of the sense node XS. Alternatively, the voltage level of the reference voltage Ref<i> may be lower than the current input analog voltage or sense voltage VSENS of the sense node XS.

Figure 4A:
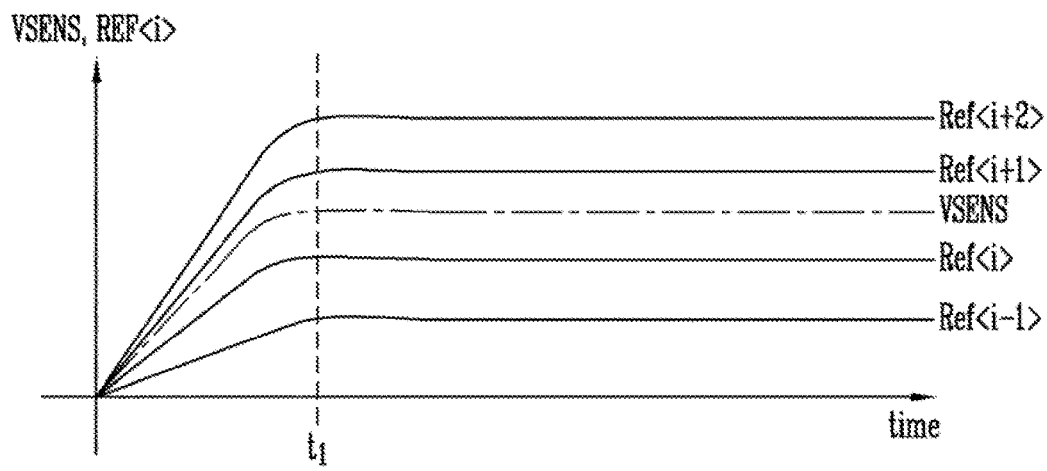
FIG. 4A shows a time-voltage graph of the input signals of an ADC in an ideal model.

FIG. 4A shows a time-voltage graph of the input signals of an ideal analog-to-digital converter (ADC).

The x-axis represents time, and the y-axis represents voltage levels of the reference voltages Ref<i−1>, Ref<i>, Ref<i+1>, and Ref<i+2>, and the voltage level of the input analog voltage or sense voltage VSENS of the sense node XS.

When there is no power supply or ground disturbance, i.e., in the absence of any ripple or fluctuation in the voltages, all the voltage levels become constant after a few microseconds from the power-on. In other words, there is no fluctuation in the reference voltages and the input analog voltage or sense voltage VSENS of the sense node XS from time $t_1$. However, this is an ideal behavior of an ADC.

Figure 4B:
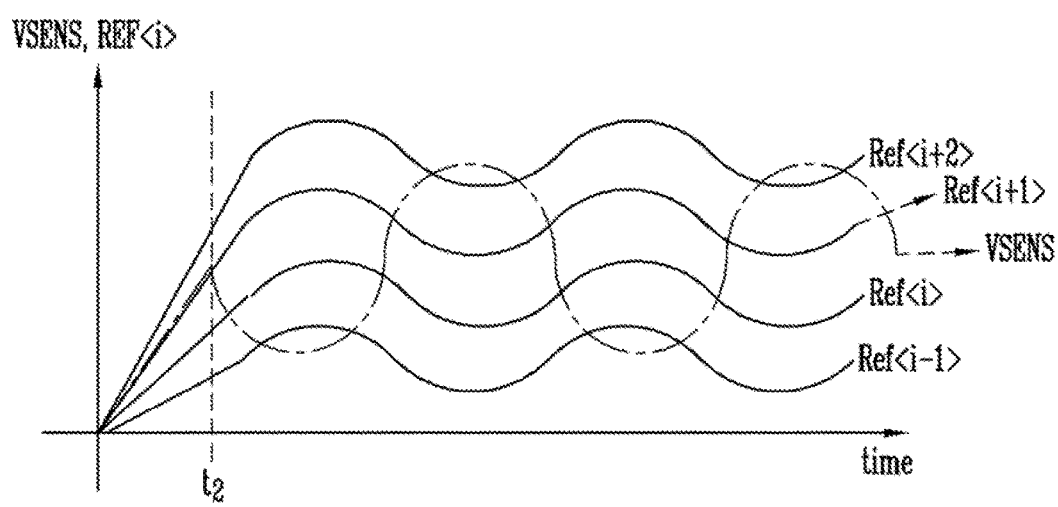
FIG. 4B shows a time-voltage graph of the input signals of an ADC in a practical model.

FIG. 4B shows an exemplary time-voltage graph of a practical analog-to-digital converter (ADC).

As is the case with FIG. 4A, the x-axis represents time, and the y-axis represents voltage levels of the reference voltages Ref<i−1>, Ref<i>, Ref<i+1>, and Ref<i+2>, and the voltage level of the input analog voltage or sense voltage VSENS of the sense node XS.

In a practical model, there are power supply or ground disturbances, i.e., disturbances introduced by the ripple of the voltages, in both of the input analog voltage or sense voltage VSENS of the sense node XS and the reference voltages Ref<i−1>~Ref<i+2>.

As shown in FIG. 4B, there are fluctuations at the reference voltages Ref<i−1>~Ref<i+2> and the input analog voltage or sense voltage VSENS of the sense node XS from time $t_2$.

Disturbances in the input analog voltage or sense voltage VSENS of the sense node XS and disturbances in the reference voltages Ref<i−1>~Ref<i+2> may have different phases and different amplitudes from each other. Error in ADC code may thus take place because the voltage level of the input analog voltage or sense voltage VSENS of the sense node XS may cross over one or more voltage levels of the reference voltages.

Figure 4C:
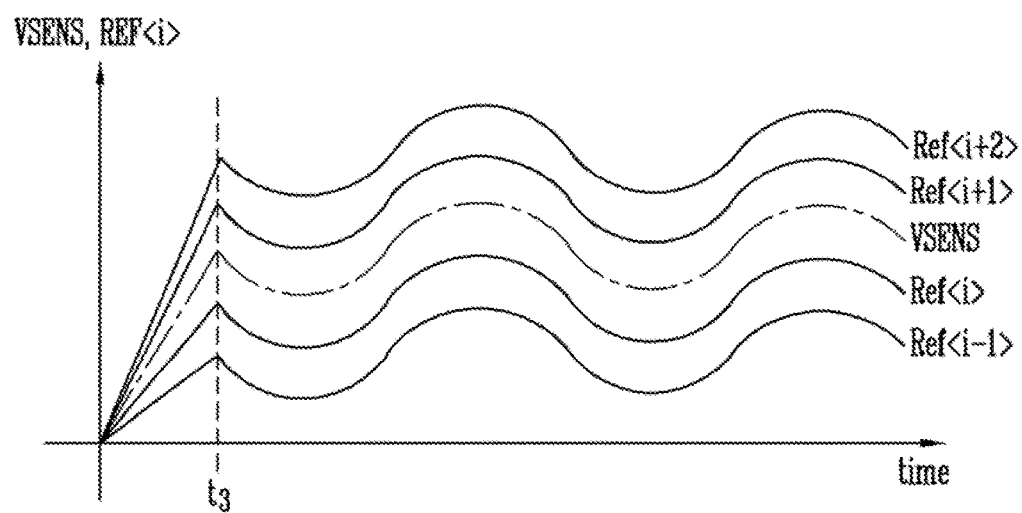
FIG. 4C shows a time-voltage graph of the input signals of the ADC according to one embodiment.

FIG. 4C shows an exemplary time-voltage graph of the input signal of the analog-to-digital converter (ADC) according to one embodiment.

As with FIG. 4A, the x-axis represents time, and the y-axis represents voltage levels of the reference voltages Ref<i−1>, Ref<i>, Ref<i+1>, and Ref<i+2>, and the voltage level of the input analog voltage or sense voltage VSENS of the sense node XS.

As shown in FIG. 4C, there are fluctuations in the reference voltages and the input analog voltage or sense voltage VSENS of the sense node XS from time $t_3$.

In particular, a disturbance in the power supply voltage or ground voltage still impacts both the input analog voltage or sense voltage VSENS of the sense node XS and the reference voltages Ref<i−1>~Ref<i+2>. However, the phase difference between the disturbance in the input analog voltage or sense voltage VSENS of the sense node XS and the disturbances in the closest reference voltage Ref<i>, Ref<i+1> is greatly reduced, due to the voltage stabilizer 40. In particular, the phase difference between the disturbance in the input analog voltage or sense voltage VSENS of the sense node XS and the disturbances in the closest reference voltages Ref<i>, Ref<i+1> is greatly reduced, due to the first capacitor $C_a$ and the second capacitor $C_b$ of the voltage stabilizer 40 as shown in FIG. 3. In a similar manner, the amplitude difference between the disturbance in the input analog voltage or sense voltage VSENS of the sense node XS and the disturbances in the closest reference voltages Ref<i>, Ref<i+1> is greatly reduced, also due to the first capacitor $C_a$ and the second capacitor $C_b$ of the voltage stabilizer 40 as shown in FIG. 3. Error in ADC is thus reduced because the signal difference between the input analog voltage or sense voltage VSENS of the sense node XS and the closest reference voltages Ref<i>, Ref<i+1> remains substantially constant.

Figure 5:
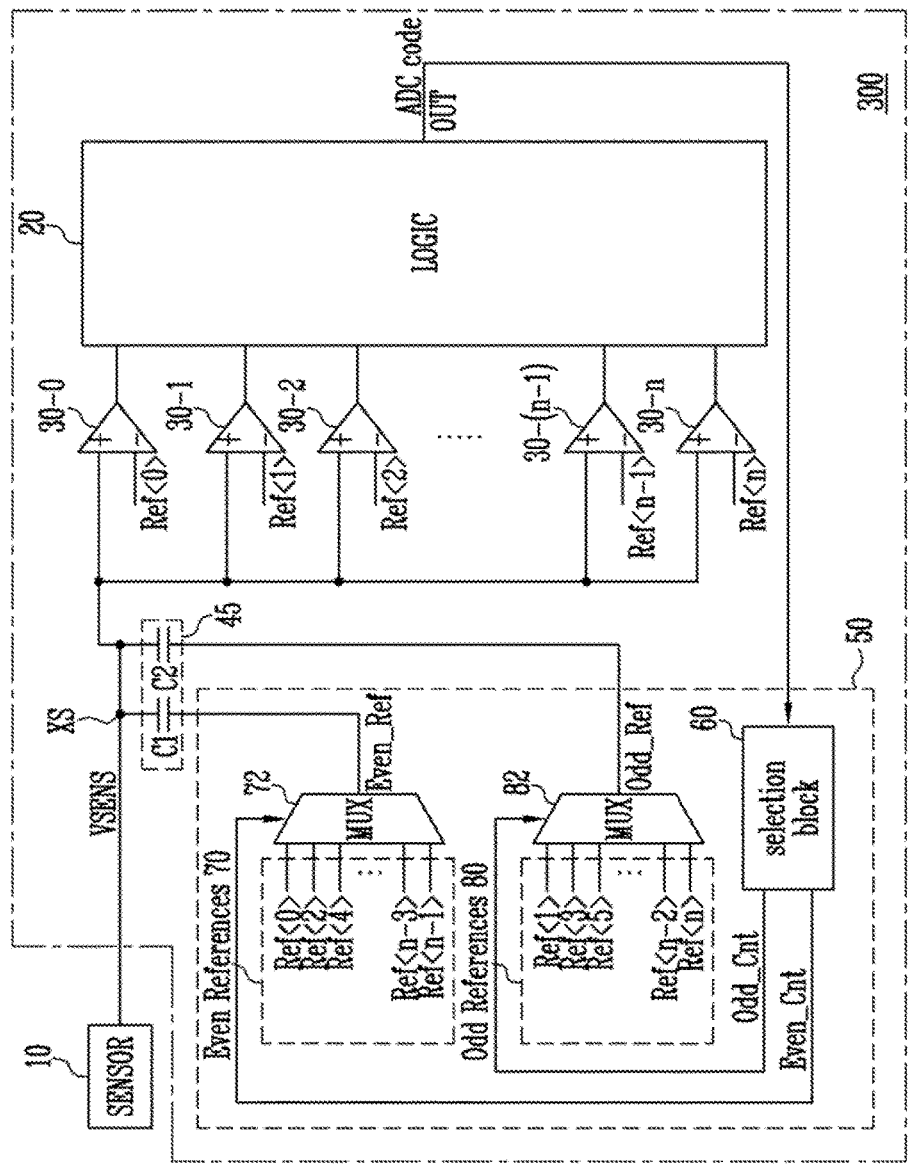
FIG. 5 schematically shows an ADC coupled with a sensor according to another embodiment.

FIG. 5 schematically shows an analog-to-digital converter (ADC) 300 coupled with a sensor 10 according to another embodiment.

As is the case with the embodiment shown in FIG. 3, the ADC 300 may convert an input analog voltage VSENS to an output digital code, e.g., ADC code. The ADC 300 may comprise a first or input node XS receiving the input analog voltage VSENS provided by the sensor 10. The input node XS may also be indicated as sense node XS, and the input analog voltage VSENS may be indicated as sense voltage VSENS.

The ADC 300 may further comprise, a plurality of comparators 30-0~30-n coupled between the sense node XS and a plurality of input terminals of a logic circuit block 20, and the plurality of comparators 30-0~30-n may receive a plurality of reference voltages Ref<0>~Ref<n> at their respective inputs.

The inputs of each comparator 30-*i* thus receive the input analog, voltage or sense voltage VSENS and a corresponding reference voltage Ref<i> of the plurality of reference voltages Ref<0>~Ref<n>.

The logic circuit block 20 is adapted to receive outputs of the plurality of comparators 30-0~30-*n* and to generate the output digital code ADC code at an output terminal OUT.

The ADC 300 may also comprise a voltage stabilizer 45 coupled between the sense node XS and a reference voltage selection circuit block 50. According to one embodiment, the voltage stabilizer may comprise a first capacitor C1 and a second capacitor C2 that are coupled between the sense node XS and the reference voltage selection circuit block 50. The reference voltage selection circuit block 50 is adapted to receive the output digital code, e.g., ADC code, and to select a first reference voltage Even_Ref from a plurality of even reference voltages 70 by means of an even reference multiplexer 72, which may receive the plurality of the even reference voltages 70 at its input and to output the first reference voltage Even_Ref to the first capacitor C1.

Moreover, the reference voltage selection circuit block 50 is adapted to receive the output digital code, e.g., ADC code, and to select a second reference voltage Odd_Ref from a plurality of odd reference voltages 80, by means of an odd reference multiplexer 82, which may receive the plurality of the odd references voltages 80 at its input and to output the second reference voltage Odd_Ref to the second capacitor C2.

In other words, the output of the even reference multiplexer 72 is coupled to the first capacitor C1, and the output of the odd reference multiplexer 82 is coupled to the second capacitor C2.

In accordance with one embodiment, the reference voltage selection, circuit block 50 may further comprise a selection block 60 adapted to receive the output digital code, e.g., ADC code, and to generate one or more even reference selection signals Even_Cnt to be provided to the even reference multiplexer 72 and one or more odd reference selection signals Odd_Cnt to be provided to the odd reference multiplexer 82. In one example, to discriminate among a set of N odd reference signals, a number of M odd selection signals is needed, where $2^M=N$.

In accordance with one embodiment, based on the output digital code (e.g., ADC code) generated from the logic block 20, the selection block 60 is adapted to output the even reference selection signals Even_Cnt and the odd reference selection signals Odd_Cnt, such that the first reference voltage Even_Ref coupled with the first capacitor C1 is the closest to the voltage level of the input analog voltage or sense voltage VSENS of the first or sense node XS among the even reference voltages 70 and also such that the second reference voltage Odd_Ref coupled with the second capacitor C2 is the closest to the voltage level of the input analog voltage or sense voltage VSENS of the first or sense node XS among the odd reference voltages 80.

Figure 6A:
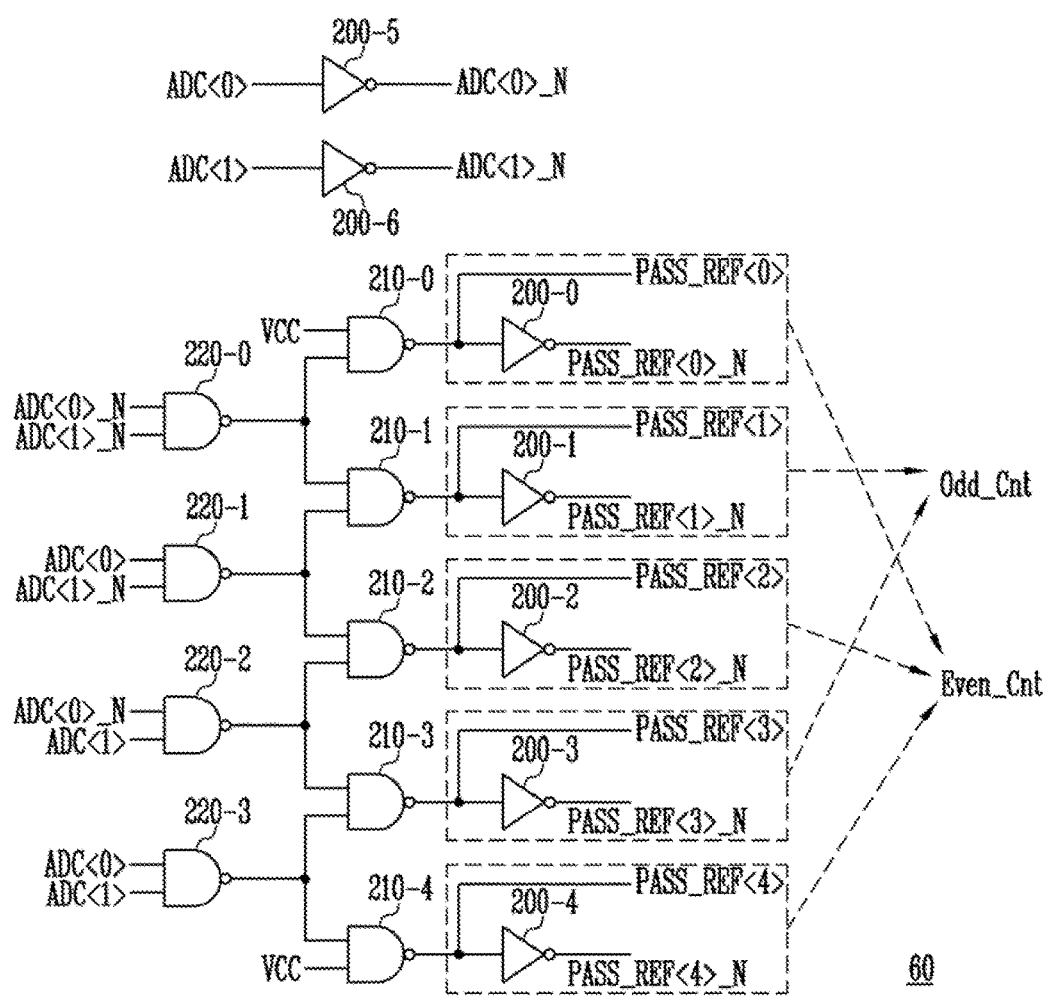
FIG. 6A shows a selection circuit block of the ADC of FIG. 5.

FIG. 6A shows the selection block 60 of the ADC as shown in FIG. 5 according to one exemplary embodiment, when the output digital code (e.g., ADC code) generated from the logic block 20 is a 2 bit code.

The ADC code may comprise a low bit ADC code ADC<0> and a high bit ADC code ADC<1>. The selection block 60 comprises a plurality of inverters 200-0~200-*m* and a plurality of intermediate NAND gates 210-0~210-*m* and input NAND gates 220-0~22. Although FIG. 6A shows only inverters 200-0~200-6 and NAND gates 210-0~210-4 and 220-0~220-3, the present disclosure is not limited thereto and those skilled in the art will readily appreciate that more inverters and NAND gates or other logic gate types can be added if and where necessary.

According to one embodiment shown in FIG. 6A, the selection block 60 may comprise a plurality of inverters, e.g., inverters 200-5 and 200-6 receiving bits of the ADC code at their input. More specifically, the inverter 200-5 may receive a low ADC code ADC<0>, and the inverter 200-6 may receive a high ADC code ADC<1>. The selection block 60 may further include inverters 200-0~200-4 having their inputs connected to respective outputs of a plurality of intermediate NAND gates 210-0~210-4. Moreover, the selection block 60 may further comprise a plurality of input NAND gates 220-0~220-3 for receiving, at their inputs, the low bit ADC code ADC<0>, the negated low bit ADC code ADC<0>_N, the high bit ADC code ADC<0>, and the negated high bit ADC code ADC<1>_N.

More specifically, the first input NAND gate 220-0 may include two inputs for receiving the negated low bit ADC code ADC<0>_N and the negated high bit ADC code ADC<1>_N and an output coupled to an input of the first intermediate NAND gate 210-0, the other input of which receives a power supply voltage VCC, and also coupled to an input of the second intermediate NAND gate 210-1.

Similarly, the low bit ADC code ADC<0> and the negated high bit ADC code ADC<1>_N are inputted to the second input NAND gate 220-1, the output of which is coupled to inputs of the second intermediate NAND gate 210-1 and third intermediate NAND gate 210-2. The negated low bit ADC code ADC<0>_N and the high bit ADC code ADC<1> are inputted to the third input NAND gate 220-2, the output of which is coupled to inputs of the third intermediate NAND gate 210-2 and fourth intermediate NAND gate 210-3. Finally, the low bit ADC code ADC<0> and the high bit ADC code ADC<1> are inputted to the fourth input NAND gate 220-3, the output of which is coupled to inputs of the fourth intermediate NAND gate 210-3 and fifth intermediate NAND gate 210-4. The other input of the fifth intermediate NAND gate 210-4 may receive the power supply voltage VCC.

In this way, the first intermediate NAND gate 210-0 generates a selection signal for a zeroth reference voltage PASS_REF<0>, and its negated voltage signal PASS_REF<0>_N is output by the first inverter 200_0. The second intermediate NAND gate 210-1 generates a selection signal for a first reference voltage PASS_REF<1>, and its negated voltage signal PASS_REF<1>_N is output by the second inverter 200_1. The third intermediate NAND gate 210-2 generates a selection signal for a second reference voltage PASS_REF<2>, and its negated voltage signal PASS_REF<2>_N is output by the thud inverter 200_2. The fourth intermediate NAND gate 210-3 generates a selection signal for a third reference voltage PASS_REF<3>, and its negated voltage signal PASS_REF<3>_N is output by the fourth inverter 200_3. Finally, the fifth intermediate NAND gate 210-4 generates a selection signal for a fourth reference voltage PASS_REF-<4>, and its negated voltage signal PASS_REF<4>_N is output by the fifth inverter 200-4.

The signals PASS_REF<0>, PASS_REF<0>_N, PASS_REF<2>, PASS_REF<2>_N, PASS_REF<4>, and PASS_REF<4>_N shown in FIG. 6A may belong to the even reference selection signal set Even_Cnt shown in FIG. 5. The signals PASS_REF<1>, PASS_REF<1>_N, PASS_REF<3>, and PASS_REF<3>_N shown in FIG. 6A may belong to the odd reference selection signal set Odd_Cnt shown in FIG. 5.

Figure 6B:
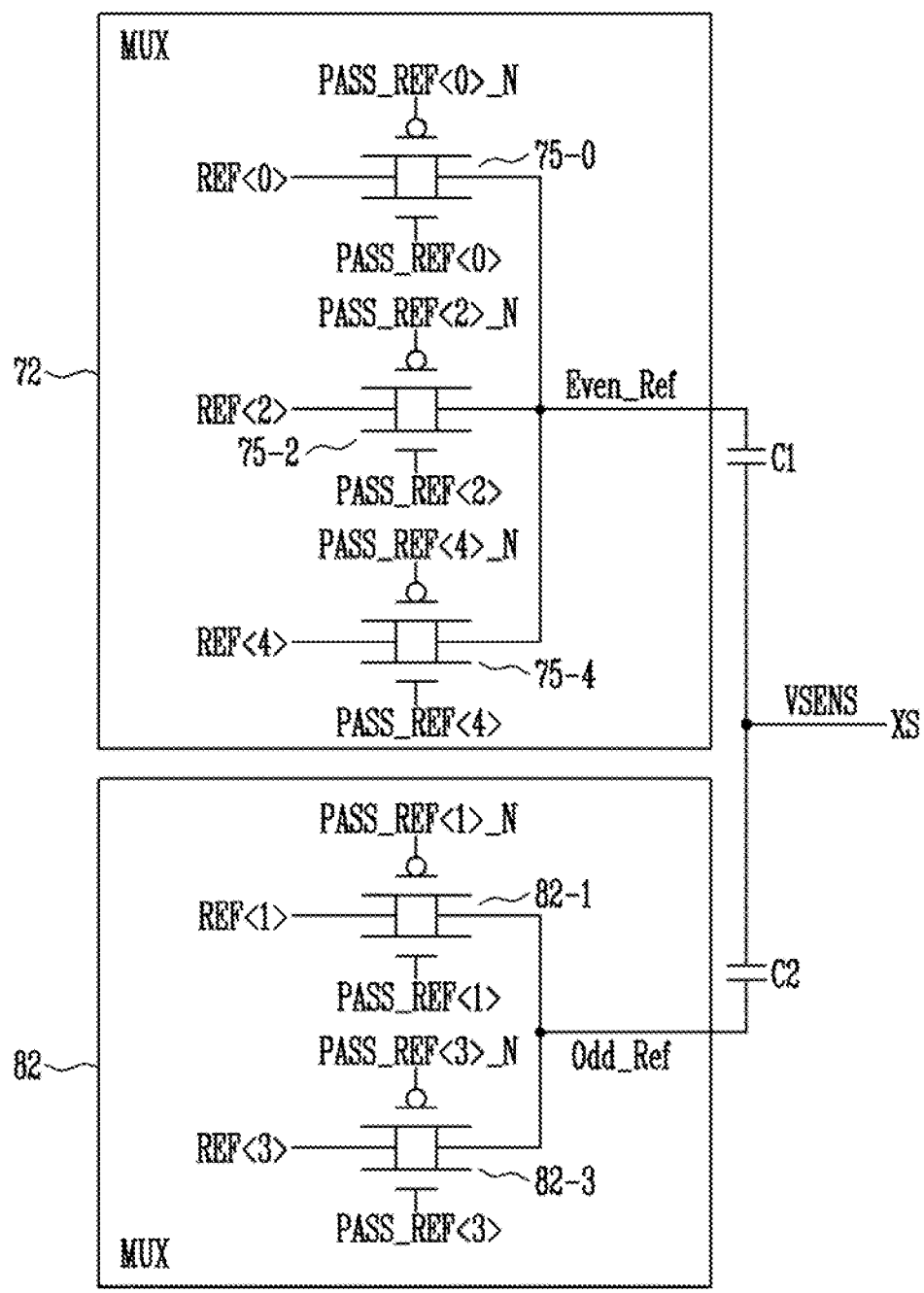
FIG. 6B shows a detailed configuration of the multiplexers of the ADC of FIG. 5.

FIG. 6B shows an exemplary configuration of the multiplexers 72 and 82 of the ADC as shown in FIG. 5 according to one embodiment.

The even reference multiplexer 72 may comprise a first switch 75-0 for switching a zeroth reference voltage REF<0>, a second switch 75-2 for switching a second reference voltage REF<2>, and a third switch 75-4 for switching a fourth reference voltage REF<4>. The odd reference multiplexer 82 may comprise a fourth switch 82-1 for switching a first reference voltage REF<1> and a fifth switch 82-3 for switching, a third reference voltage REF<3>.

The switches may be CMOS (Complementary metal-oxide-semiconductor) switches, but the embodiment of the present disclosure is not limited thereto.

The first switch 75-0 has its gates coupled with the selection signal PASS_REF<0> and its negated signal PASS_REF<0>_N. In this way, the zeroth reference voltage REF<0> is coupled with the first capacitor C1 when the selection signal PASS_REF<0> is high and its negated selection signal PASS_REF<0>_N is low.

The second switch 75-2 has its gates coupled with the selection signal PASS_REF<2> and its negated signal PASS_REF<2>_N. In this way, the second reference voltage REF<2> is coupled with the first capacitor C1 when the selection signal PASS_REF<2> is high and its negated selection signal PASS_REF<2>_N is low.

The third switch 75-4 has its gates coupled with the selection signal PASS_REF<4> and its negated signal PASS_REF<4>_N. In this way, the fourth reference voltage REF<4> is coupled with the first capacitor C1 when the selection signal PASS_REF<4> is high and its negated selection signal PASS_REF<4>_N is low.

The fourth switch 82-1 has its gates coupled with the selection signal PASS_REF<1> and its negated signal PASS_REF<1>_N. In this way, the first reference voltage REF<1> is coupled with the second capacitor C2 when the selection signal PASS_REF<1> is high and its negated selection signal PASS_REF<1>_N is low.

The fifth switch 82-3 has its gates coupled with the selection signal PASS_REF<3> and its negated signal PASS_REF<3>_N. In this way, the third reference voltage REF<3> is coupled with the second capacitor C2 when the selection signal PASS_REF<3> is high and its negated selection signal PASS_REF<3>_N is low.

In this manner, the ADC is controlled such that the even reference voltage closest to the voltage level of the input analog voltage or sense voltage VSENS of the first or sense node XS is coupled to the first capacitor C1, and the odd reference voltage closest to the voltage level of the input analog voltage or sense voltage VSENS of the first or sense node XS is coupled to the second capacitor C2.

Figure 7:
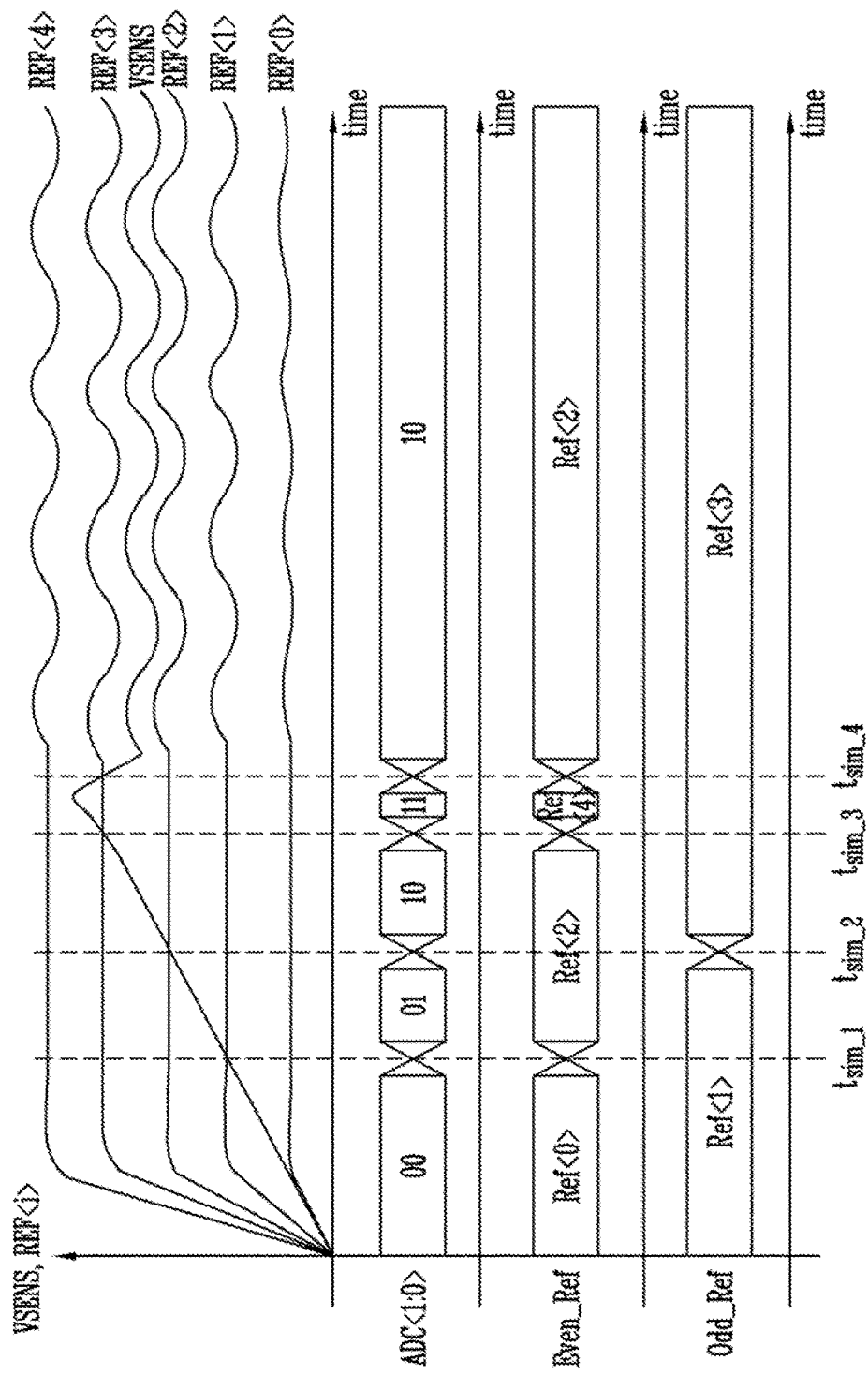
FIG. 7 shows a timing diagram depicting the change of voltage at a sense node of the ADC of FIG. 5, the corresponding reference voltages and the output digital code.

FIG. 7 shows a timing diagram depicting the change of the voltage level of the input analog voltage or sense voltage VSENS of the first or node XS, and the changes of reference voltages in the ADC according to one embodiment as shown in FIG. 5.

From 0 through a first time $t_{sim\_1}$, a second time $t_{sim\_2}$, a third time $t_{sim\_3}$ and till a fourth time $t_{sim\_4}$, the voltage level of the sense voltage VSENS at the sense node XS tends to gradually increase without power supply or ground disturbances. Then, from the fourth time $t_{sim\_4}$, the voltage level of the sense voltage VSENS provided by the sensor 10 is fixed as a substantially constant value while power supply or ground disturbances make all the reference voltages REF<0>~REF<4> and the voltage level of the sense voltage VSENS fluctuate.

From 0 to the first time $t_{sim\_1}$, the voltage level of the sense voltage VSENS at the sense node XS is greater than the zeroth reference voltage REF<0> and less than the first reference voltage REF<1>. Therefore, the ADC code is set to be 00. Also, the first reference voltage Even_Ref coupled to the first capacitor C1 is the zeroth reference voltage Ref<0>, and the second reference voltage Odd_ Ref coupled to the second capacitor C2 is the first reference voltage Ref<1>.

From the first time $t_{sim\_1}$ to the second time $t_{sim\_2}$, the voltage level of the sense voltage VSENS at the sense, node XS is greater than the first reference voltage REF<1> and less than the second reference voltage REF<2>. Therefore, the ADC code is 01, while the first reference voltage Even_Ref coupled to the first capacitor C1 is the second reference voltage Ref<2>, and the second reference voltage Odd_Ref coupled to the second capacitor C2 is the first reference voltage Ref<1>.

From the second time $t_{sim\_2}$ to the third time $t_{sim\_3}$, the voltage level of the sense voltage VSENS at the sense node XS is greater than the second reference voltage REF<2> and less than the third reference voltage REF<3>. Therefore, the ADC code is while the first reference voltage Even_Ref coupled to the first capacitor C1 is the second reference voltage Ref<2>, and the second reference voltage Odd_Ref coupled to the second capacitor C2 is the third reference voltage Ref<3>.

From the third time $t_{sim\_3}$ to the fourth time $t_{sim\_4}$, the voltage level of the sense voltage VSENS at the sense node XS is greater than the third reference voltage REF<3> and less than the fourth reference voltage REF<4>. Therefore, the ADC code is 11, while the first reference voltage Even_Ref coupled to the first capacitor C1 is the fourth reference voltage Ref<4>, and the second reference voltage Odd_Ref coupled to the second capacitor C2 is the third reference voltage Ref<3>.

From the fourth time $t_{sim\_4}$, the voltage level of the sense voltage VSENS of the sense node XS is greater than the second reference voltage REF<2> and less than the third reference voltage REF<3>. Therefore, the ADC code is 10, while the first reference voltage Even_Ref coupled to the first capacitor C1 is the second reference voltage Ref<2>, and the second reference voltage Odd_Ref coupled to the second capacitor C2 is the third reference voltage Ref<3>.

Due to the first and second capacitors C1 and C2, the closest references voltage REF<2> and REF<3> are strongly coupled to the first or sense node XS. The fourth reference voltage REF<4> and the first reference voltage REF<1> are less coupled to the first or sense node VSENS than the third reference voltage REF<3> and the second reference voltage REF<2>. The zeroth reference voltage REF<0> is less coupled to the first or sense node XS than the third reference voltage REF<3> and the second reference voltage REF<2>.

According to the embodiment, two adjacent reference voltages (i.e., one even and one odd reference voltages) are linked at the first or sense node XS through the first and second capacitors C1 and C2. The second reference voltage REF<2> and the third reference voltage REF<3> resembles the waveform of the voltage level of the sense voltage VSENS of the first or sense node XS due to the capacitors C1 and C2. Therefore, in a steady state phase, the voltage level of the sense voltage VSENS of the first or sense node XS will be contained between the second reference voltage REF<2> and the third reference voltage REF<3>, to generate the correct output digital code, ADC code.

Figure 8:
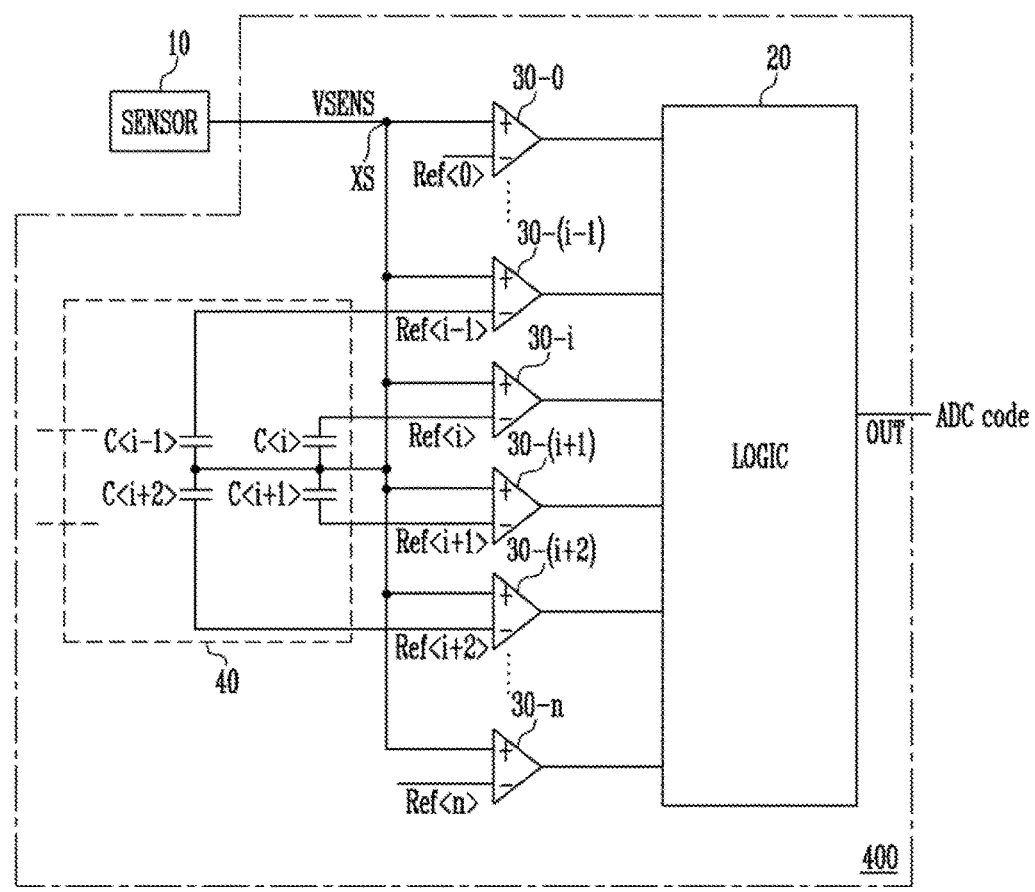
FIG. 8 shows an ADC coupled with a sensor according to yet another embodiment.

FIG. 8 shows an analog-to-digital converter (ADC) 400 coupled with a sensor 10 according to another embodiment.

As is different from the embodiment shown in FIG. 3, more than two capacitors may be coupled with the reference voltages.

The ADC 400 may convert an input analog voltage VSENS to an output digital code, ADC code. The ADC 400 may comprise a first or input node XS receiving the input analog voltage VSENS provided by the sensor 10. The input node XS may be indicated as sense node, and the input analog voltage VSENS may be indicated as sense voltage.

The ADC 400 may further comprise a plurality of comparators 30-0~30-$n$ coupled between the sense node XS and a plurality of input terminals of a logic circuit block 20, and the plurality of comparators 30-0~30-$n$ may receive a plurality of reference voltages Ref<0>~Ref<n> at their respective inputs.

The inputs of each comparator 30-$i$ may thus receive the input analog voltage or Sense voltage VSENS and a corresponding reference voltage Ref<i> of the plurality of reference voltages Ref<0>~Ref<n>. Further, the logic circuit block 20 is adapted to receive outputs of the plurality of comparators 30-0~30-$n$ and to generate the output digital code ADC code at an output terminal OUT. According to one embodiment, the logic circuit block 20 may include suitable circuit elements adapted to output appropriate ADC codes depending on the output values from the comparators 30-0~30-$n$. For instance, the logic circuit block 20 may include a hardware circuit adapted to output 00, 01, 10, and 11 (as shown in FIG. 7) as a result of comparing sense voltage VSENS with reference voltages Ref<0>~Ref<4>.

The ADC 400 may comprise a voltage stabilizer 40. The voltage stabilizer 40 may be a capacitor block including a plurality of capacitors C<i> connected to respective inputs of two different comparators 30-$i$30-(i+1). For brevity of explanation, the voltage stabilizer 40 including four capacitors will be explained with reference to FIG. 8, in which the voltage stabilizer 40 comprises a first capacitor C<i−1>, a second capacitor C<i>, a third capacitor C<i+1>, and a fourth capacitor C<i+2>.

The ADC 400 may be adapted to determine, among the plurality of reference voltages Ref<0>~Ref<n> nodes, a first reference voltage Ref<i−1> node to be coupled to the first capacitor C<i−1>, a second reference voltage Ref<i> node to be coupled to the second capacitor C<i>, a third reference voltage Ref<i+1> node to be coupled to the third capacitor C<i+1>, and a fourth reference voltage Ref<i+2> node to be coupled to the fourth capacitor C<i+2>.

In accordance with one embodiment, the voltage levels of the first and second reference voltages Ref<i−1>, Ref<i> may be set lower than the voltage level of the sense voltage VSENS of the first or sense node XS. The voltage levels of the third and fourth reference voltages Ref<i+1>, Ref<i+2> may be set higher than the voltage level of the sense voltage VSENS of the first or sense node XS. The second reference voltage Ref<i> is the closest lower reference voltage to the sense voltage VSENS, and the first reference voltage Ref<i−1> is the next closest lower reference voltage to the sense voltage VSENS. The third reference voltage Ref<i+1> is the closest higher reference voltage to the sense voltage VSENS, and the fourth reference voltage Ref<i+2> is the next closest higher reference voltage to the sense voltage VSENS.

In this way, the first group of reference voltages (e.g., the first and second reference voltages Ref<i−1>, Ref<i>) is symmetrical to the second group of reference voltages (e.g., the third and fourth reference voltages Ref<i+1>, Ref<i+2>) with respect to the current input analog voltage or sense voltage VSENS.

By including more than two capacitors according to one embodiment, enhanced immunity to a power supply or ground disturbance can be achieved. Although the voltage stabilizer 40 includes four capacitors in one embodiment shown in FIG. 8, one skilled in the art will appreciate that the number of the capacitors is not limited to four, and any suitable number of capacitors can be used in various embodiments.

In accordance with one embodiment, the ADC may be adapted to couple terminals of the capacitors in a first group with the first or sense node XS and respective reference voltages in a first group. Here, the voltage level of the first group of reference voltages may be higher than the current input analog voltage or sense voltage VSENS of the first or sense node XS. Additionally, the ADC may be adapted to couple terminals of the capacitors in a second group with the first or sense node XS and respective reference voltages in a second group. Here, the voltage level of the second group of reference voltages may be lower than the current input analog voltage or sense voltage VSENS of the first or sense node XS. In FIG. 8, the third and fourth capacitors, C<i+1> and C<i+2>, may belong to the first group of capacitors, while the first and second capacitors, C<i−1> and C<i>, may belong to the second group of the capacitors.

The first group of reference voltages is symmetrical to the second group of reference voltages with respect to the current input analog voltage or sense voltage VSENS of the first or sense node XS. The reference voltages of the first group are the closest upper reference voltages to the current input analog voltage VSENS of the first node XS, and the reference voltages of the second group are the closest, lower reference voltages to the current input analog voltage VSENS of the first node XS.

Figure 9:
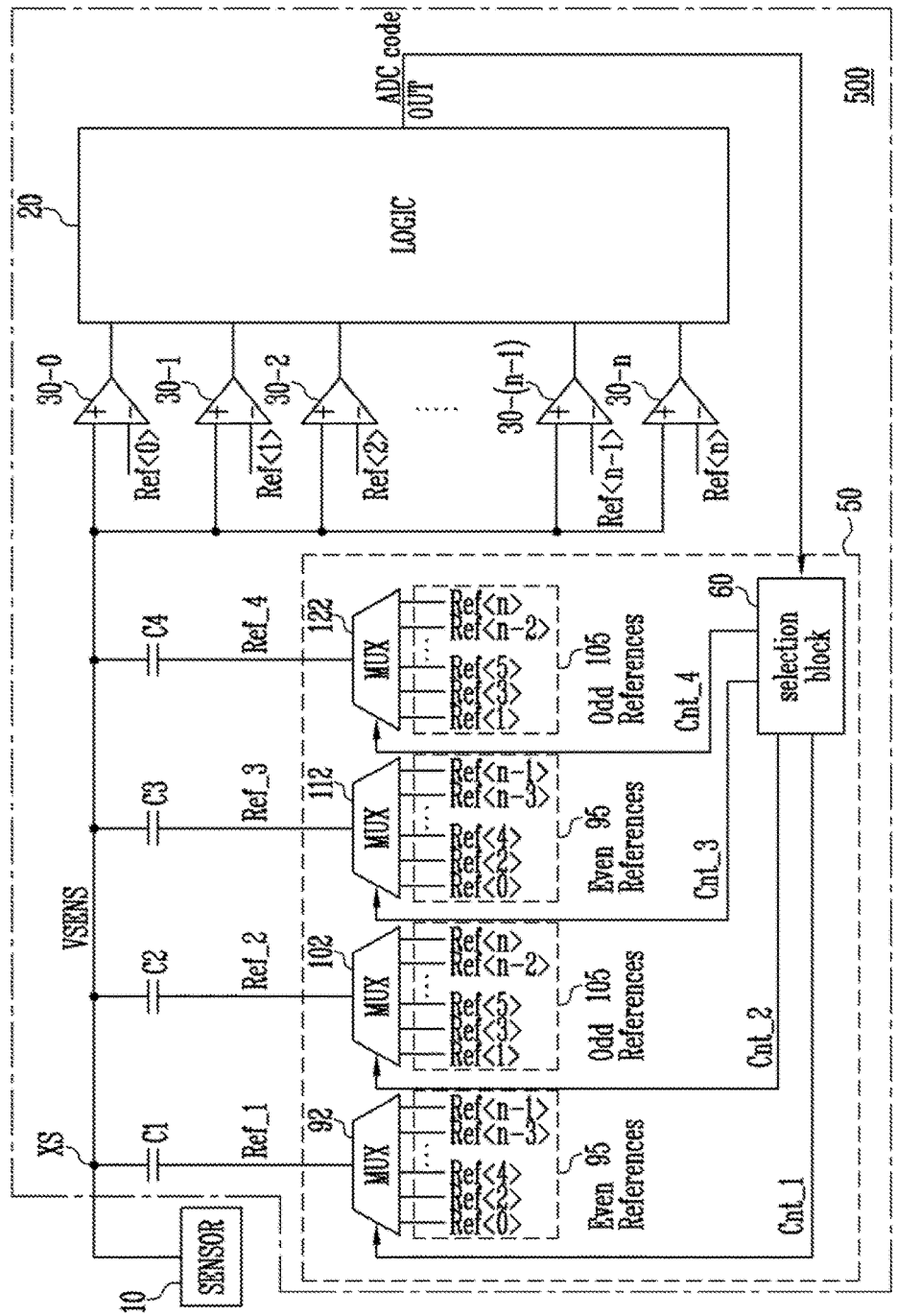
FIG. 9 schematically shows an ADC coupled with a sensor according to yet another embodiment.

FIG. 9 schematically shows an analog-to-digital converter (ADC) 500 coupled with a sensor 10 according to another embodiment.

The ADC 500 may convert an input analog voltage VSENS to an output digital code, e.g., ADC code. The ADC 500 may comprise a first or input node XS for receiving the input analog voltage VSENS provided by the sensor 10. The input node XS may also be indicated as sense node, and the input analog voltage VSENS may be indicated as sense voltage VSENS.

The ADC 500 may further comprise a plurality of comparators 30-0~30-$n$ coupled between the sense node XS and a plurality of input terminals of a logic circuit block 20, and the plurality of comparators 30-0~30-$n$ may receive, at their respective inputs, a plurality of reference voltages Ref<0>~Ref<n>.

The inputs of each comparator 30-$i$ may thus receive the input analog voltage or sense voltage VSENS and a corresponding reference voltage Ref<i> of the plurality of reference voltage Ref<0>~Ref<n>.

The logic circuit block 20 is adapted to receive outputs of the plurality of comparators 30-0~30-$n$ and to generate the output digital code ADC code at an output terminal OUT. According to one embodiment, the logic circuit block 20 may include suitable circuit elements adapted to output appropriate ADC codes depending on the output values from the comparators 30-0~30-$n$. For instance, the logic circuit block 20 may include a hardware circuit adapted to output 00, 01, 10, and 11 (as shown in FIG. 7) as a result of comparing sense voltage VSENS with reference voltages Ref<0>~Ref<4>.

The ADC 500 may also comprise a first capacitor C1, a second capacitor C2, a third capacitor C3, and a fourth capacitor C4 coupled between the sense node XS and a reference voltage selection circuit block 50. The reference voltage selection circuit block 50 is adapted to receive the output digital code, e.g., ADC code, and to select a first reference voltage Ref_1 from a plurality of the even reference voltages 95 by means of a first even reference multiplexer 92, which is adapted to receiving, at its input, the plurality of the even reference voltages 95 and to output the first reference voltage Ref_1 to the first capacitor C1. The output of the even reference multiplexer 92 is thus coupled to the first capacitor C1. A selection block 60 included in the reference voltage selection circuit block 50 controls the first even reference multiplexer 92 by a first selection signal Cnt_1.

Further, the reference voltage selection circuit block 50 is adapted to select a second reference voltage Ref_2 from a plurality of odd reference voltages 105 by means of a first odd reference multiplexer 102, which is adapted to receive, at its input, the plurality of the odd reference voltages 105 and to output the second reference voltage Ref_2 to the second capacitor C2. The output of the first odd reference multiplexer 102 is thus coupled to the second capacitor C2. The selection block 60 controls the first odd reference multiplexer 102 by a second selection signal Cnt_2.

The reference voltage selection circuit block 50 is also adapted to select a third reference voltage Ref_3 from the plurality of even reference voltages 95 by means of a second even reference multiplexer 112, which is adapted to receive, at its input, the plurality of the even reference voltages 95 and to output the third reference voltage Ref_3 to the third capacitor C3. The output of the second even reference multiplexer 112 is thus coupled to the third capacitor C3. The selection block 60 controls the second even reference multiplexer 112 by a third selection signal Cnt_3.

The reference voltage selection circuit block 50 is adapted to select a fourth reference voltage Ref_4 from the plurality of the odd reference voltages 105 by means of a second odd reference multiplexer 122, which is adapted to receive, at its input, the plurality of the odd reference voltages 105 and to output the fourth reference voltage Ref_4 to the fourth capacitor C4. The output of the second odd reference multiplexer 122 is thus coupled to the fourth capacitor C4. The selection block 60 controls also the second odd reference multiplexer 122 by a fourth selection signal Cnt_4.

Based on the output digital code (e.g., ADC code) generated from the logic block 20, the reference voltage selection circuit block 50 can control the multiplexers 92, 102, 112, 122 by means of the selection block 60 such that the second reference voltage Ref_2 and the third reference voltage Ref_3 are the closest reference voltages to the voltage level of the sense voltage VSENS of the first or sense node XS, and the first reference voltage Ref_1 and the fourth reference voltage Ref_4 are the next, closest reference voltages to the voltage level of the sense voltage VSENS of the first or sense node XS.

A first group of reference voltages may comprise the first reference voltage Ref_1 and the second reference voltage Ref_2, and a second group of reference voltages may comprise the third reference voltage Ref_3 and the fourth reference voltage Ref_4. The voltage level of the first group may be higher or lower than that of the second group, depending on the voltage level of the first or sense node XS. This can be controlled in a manner similar to the ADC in the embodiments shown in FIGS. 5, 6A, 6B, and 7.

In essence, the proposed ADC configurations as explained above are able to reduce the impact of a power supply or ground disturbance. From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An analog-to-digital converter (ADC) for converting an input analog voltage to an output digital code, the ADC comprising:
 a first node of the input analog voltage;
 nodes of a plurality of reference voltages;
 a plurality of comparators, inputs of each comparator being coupled to the first node and a node of a corresponding reference voltage among the plurality of reference voltages;
 a logic circuit block adapted to receive outputs of the plurality of comparators and generating the output digital code; and
 a voltage stabilizer, terminals of the voltage stabilizer being coupled with the first node and a node of a first reference voltage among the plurality of reference voltages,
 wherein the voltage stabilizer is configured to reduce a phase difference between a first disturb on the input analog voltage of the first node and a second disturb on the node of the first reference voltage.

2. The ADC of claim 1, wherein the voltage stabilizer comprises a first capacitor.

3. The ADC of claim 2, wherein the ADC is adapted to determine the first reference voltage among the plurality of reference voltages, the first reference voltage being the closest to the input analog voltage at the first node, and wherein the ADC is adapted to couple terminals of the first capacitor with the first node and the node of the first reference voltage.

4. The ADC of claim 3, wherein a voltage level of the first reference voltage is higher than a voltage level of the input analog voltage at the first node.

5. The ADC of claim 3, wherein a voltage level of the first reference voltage is lower than a voltage level of the input analog voltage at the first node.

6. The ADC of claim 2, further comprising: a second capacitor, a second reference voltage being selected to be coupled with the second capacitor from the plurality of the reference voltages.

7. The ADC of claim 6, wherein the ADC is adapted to determine the first reference voltage among the plurality of reference voltages, a voltage level of the first reference voltage being greater than a voltage level of the input analog voltage at the first node,
 wherein the ADC is adapted to determine the second reference voltage among the plurality of reference voltages, a voltage level of the second reference voltage being smaller than a voltage level of the input analog voltage at the first node, and
 wherein the ADC is adapted to couple terminals of the first capacitor with the first node and the node of the first reference voltage and is adapted to couple terminals of the second capacitor with the first node and a node of the second reference voltage.

8. The ADC of claim 7, wherein the first reference voltage is the closest higher reference voltage to the input analog voltage at the first node, and the second reference voltage is the closest lower reference voltage to the input analog voltage at the first node.

9. The ADC of claim 2, wherein the voltage stabilizer further comprises more than two capacitors comprising the first capacitor, and wherein the ADC is adapted to couple terminals of each of the capacitors with the first node and a node of a corresponding reference voltage of the plurality of reference voltages.

10. The ADC of claim 9, wherein a number of the capacitors coupled with the first node is odd.

11. The ADC of claim 9, wherein a number of the capacitors coupled with the first node is even.

12. The ADC of claim 9, wherein the ADC is adapted to couple terminals of each of a first group of the capacitors with the first node and each of a first group of the reference voltages, voltage levels of the first group of reference voltages being higher than a voltage value of the input analog voltage at the first node, and
wherein the ADC is adapted to couple terminals of each of a second group of the capacitors with the first node and each of a second group of the reference voltages, voltage levels of the second group of reference voltages being lower than the voltage value of the input analog voltage at the first node.

13. The ADC of claim 12, wherein the first group of reference voltages is symmetrical to the second group of reference voltages with respect to the input analog voltage.

14. The ADC of claim 12, wherein the reference voltages of the first group are the closest higher reference voltages to the input analog voltage at the first node, and the reference voltages of the second group are the closest lower reference voltages to the input analog voltage at the first node.

15. The ADC of claim 2, further comprising: a reference voltage selection circuit block adapted to receive the output digital code and selecting the first reference voltage to be coupled with the first capacitor from the plurality of reference voltages.

16. The ADC of claim 15, wherein the voltage stabilizer further comprises a second capacitor, and wherein the reference voltage selection circuit block is adapted to select a second reference voltage to be coupled with a second capacitor from the plurality of reference voltages.

17. The ADC of claim 16, wherein the reference voltage selection circuit block comprises:
an even reference multiplexer adapted to receive a plurality of even reference voltages from among the reference voltages;
an odd reference multiplexer adapted to receive a plurality of odd reference voltages from among the reference voltages; and
a selection block adapted to generate an even reference selection signal to be provided to the even reference multiplexer and an odd reference selection signal to be provided to the odd reference multiplexer,
wherein an output of the even reference multiplexer is coupled to the first capacitor, and an output of the odd reference multiplexer is coupled to the second capacitor.

18. An analog-to-digital converter (ADC), comprising:
an input node suitable for receiving an analog signal;
a comparator suitable for receiving the analog signal at a first input and a reference voltage at a second input and for outputting a result based on comparison of the analog signal and the reference voltage, the comparator comprising a capacitive stabilizer connected to the first input and the second input in common; and
an output node suitable for outputting a digital signal based on the result output from the comparator,
wherein the capacitive stabilizer is configured to reduce a phase difference between a first disturb on the analog signal at the first input and a second disturb on the reference voltage at the second input.

* * * * *